(12) United States Patent
Ogata et al.

(10) Patent No.: US 6,281,962 B1
(45) Date of Patent: Aug. 28, 2001

(54) PROCESSING APPARATUS FOR COATING SUBSTRATE WITH RESIST AND DEVELOPING EXPOSED RESIST INCLUDING INSPECTION EQUIPMENT FOR INSPECTING SUBSTRATE AND PROCESSING METHOD THEREOF

(75) Inventors: Kunie Ogata, Yokohama; Koki Nishimuko, Kumamoto, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/465,681

(22) Filed: Dec. 17, 1999

(30) Foreign Application Priority Data

Dec. 17, 1998 (JP) .................................. 10-375580

(51) Int. Cl.[7] .......................... G03B 27/32; G03B 29/00; G03D 5/00; B05C 11/02; B05C 11/00
(52) U.S. Cl. .............................. 355/27; 355/28; 355/29; 396/611; 118/52; 118/56; 118/58; 118/666; 118/667; 118/668
(58) Field of Search .................. 355/28, 27, 29; 396/611; 118/52, 56, 58, 667, 666, 668

(56) References Cited

U.S. PATENT DOCUMENTS 5,826,129 * 10/1998 Hasebe et al. ................... 396/611
5,876,280 * 3/1999 Kitano et al. ..................... 454/187
5,972,110 * 10/1999 Akimoto ............................ 118/52

FOREIGN PATENT DOCUMENTS 2-40909   2/1990 (JP) .
10-43666  2/1998 (JP) .
10-247621 9/1998 (JP) .

* cited by examiner

*Primary Examiner*—Russell Adams
*Assistant Examiner*—Khaled Brown
(74) *Attorney, Agent, or Firm*—Rader, Fishman & Grauer

(57) ABSTRACT

Inspection equipment for detecting defects in a wafer is provided in a coating and developing system including a plurality of kinds of processing units for performing processing necessary for coating a wafer with a resist and processing necessary for developing the resist on the wafer. The transfer of the wafer between the processing units and the inspection equipment is performed by means of a main transfer device. The inspection equipment sends an inspection result as a detection signal to a controller, and the controller which receives the detection signal controls exposure conditions for an aligner according to the presence or absence of defects and adjusts a frequency regulating mechanism to control inspection frequency. The wafer is transferred between the processing units and the inspection equipment by the main transfer device, whereby the wafer is not artificially contaminated.

16 Claims, 9 Drawing Sheets

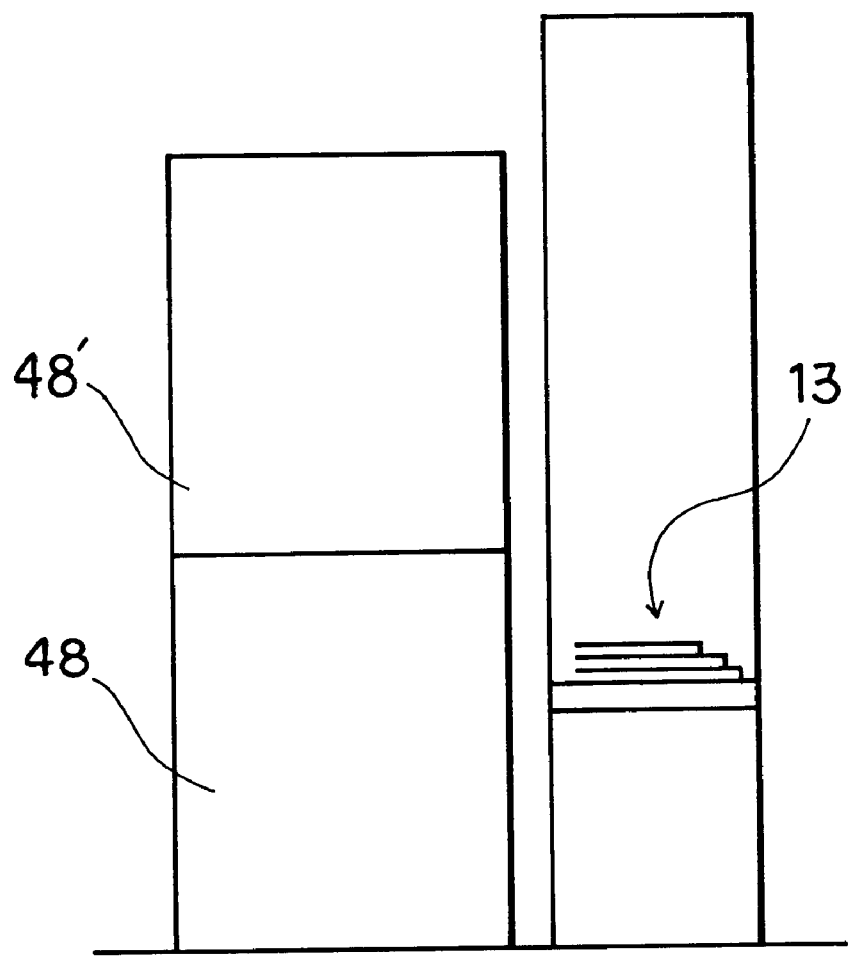
F I G. 4

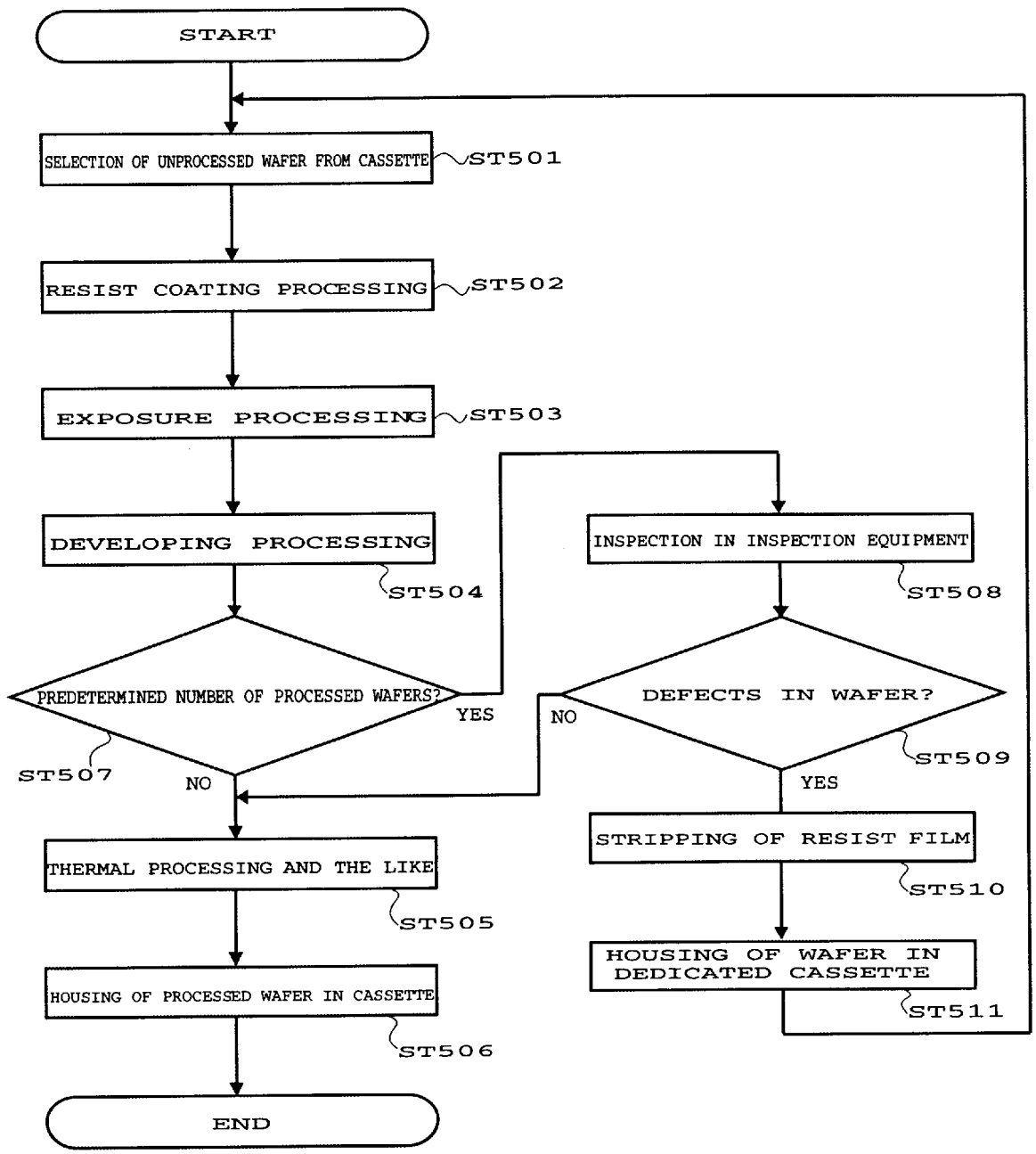
F I G. 5

PROCESSING APPARATUS FOR COATING SUBSTRATE WITH RESIST AND DEVELOPING EXPOSED RESIST INCLUDING INSPECTION EQUIPMENT FOR INSPECTING SUBSTRATE AND PROCESSING METHOD THEREOF

BACKGROUND OF THE INVENTION

1. Field of the Invention

The present invention relates to a processing apparatus applied to the photolithography for forming a desired pattern of a resist film, for example, on a semiconductor wafer and a substrate such as a glass substrate for a liquid crystal display device or the like and a processing method thereof.

2. Description of the Related Art

In processes of semiconductor device fabrication, the photolithography for forming a resist film, for example, on a surface of a semiconductor wafer (hereinafter referred to as "a wafer") or the like is performed. The photolithography consists of various processing steps such as resist coating processing for coating a wafer with a resist, exposure processing for exposing the resist-coated wafer, thermal processing for heating the wafer, developing processing for developing the exposed wafer, and the like, and these various processing steps are performed, for example, in a coating and developing system.

In the above fabrication processes, a wafer inspection process for inspecting whether the thickness of a resist film or the pattern-formed line width is formed into a predetermined thickness or a predetermined line width, for example, is performed for wafers which have undergone resist coating processing or developing processing. The wafer inspection process is performed in inspection equipment provided independently of the coating and developing system.

Specifically, an operator selects a wafer out of wafers which have undergone resist coating processing, developing processing, or the like, for example, for every given period of time or every given number of wafers, and takes the selected wafer to the place of the inspection equipment to inspect the surface of the wafer.

However, a wafer selected from the resist coating unit, a developing unit, or the like is taken to inspection equipment to undergo inspections by an operator himself or herself, whereby there is a possibility that the wafer is artificially contaminated while being taken to the inspection equipment or when being carried into the equipment.

SUMMARY OF THE INVENTION

An object of the present invention is to provide a processing apparatus and a processing method thereof capable of preventing artificial contamination of a substrate.

To attain the above object, a first aspect of the present invention is a processing apparatus for coating a substrate with a resist and developing the exposed resist on the substrate, comprising a plurality of kinds of processing units for performing processing necessary for coating the substrate with the resist and processing necessary for developing the resist on the substrate, inspection equipment for inspecting the substrate which has undergone processing in one of the processing units and detecting the presence or absence of a defect in the substrate, and transfer means for transferring the substrate between the processing units and between the processing units and the inspection equipment.

A second aspect of the present invention is a processing apparatus for coating a substrate with a resist and developing the exposed resist on the substrate, comprising (a) a processing station including a coating unit for coating the substrate with the resist, a developing unit for developing the exposed resist on the substrate, and a first transfer device for transferring the substrate between the coating unit and the developing unit, and (b) a housing station disposed adjacent to the processing station, including inspection equipment for detecting the presence or absence of a defect in the substrate, a housing section for housing a plurality of substrates before and after processing in the processing station and a plurality of substrates in which defects are detected by the inspection equipment, and a second transfer device for transferring the substrate between the processing station and the housing section.

A third aspect of the present invention is a processing apparatus for coating a substrate with a resist and developing the exposed resist on the substrate, comprising (a) a processing station including a coating unit for coating the substrate with the resist, a developing unit for developing the exposed resist on the substrate, a multi-tiered processing unit group in which at least a heating unit for heat-treating the substrate and inspection equipment for detecting the presence or absence of a defect in the substrate are multi-tiered, and a first transfer device for transferring the substrate between the coating unit, the developing unit, and the multi-tiered processing unit group, and (b) a housing station disposed adjacent to the processing station, including a housing section for housing a plurality of substrates before and after processing in the processing station, and a plurality of substrates in which defects are detected by the inspection equipment, and a second transfer device for transferring the substrate between the processing station and the housing section.

A fourth aspect of the present invention is a processing apparatus, disposed adjacent to an aligner for exposing a resist coated on a substrate, for coating the substrate with the resist and developing the resist on the substrate exposed by the aligner, comprising (a) a processing station including a coating unit for coating the substrate with the resist, a developing unit for developing the exposed resist on the substrate, a delivery unit for delivering the substrate, and a first transfer device for transferring the substrate between the coating unit, the developing unit, and the delivery unit, and (b) an interface section disposed between the processing station and the aligner, including a housing section for temporarily housing the substrate which is carried into/out of the aligner, inspection equipment for detecting the presence or absence of a defect in the substrate, and a second transfer device for transferring the substrate between the aligner, the delivery unit in the processing station, the housing section, and the inspection equipment.

A fifth aspect of the present invention is a processing apparatus, disposed adjacent to an aligner for exposing a resist coated on a substrate, for coating the substrate with the resist and developing the resist on the substrate exposed by the aligner, comprising (a) a processing station including a coating unit for coating the substrate with the resist, a developing unit for developing the exposed resist on the substrate, and a first transfer device for transferring the substrate between the coating unit and the developing unit, (b) a housing station disposed adjacent to the processing station, including a housing section for housing a plurality of substrates before and after processing in the processing station, and a second transfer device for transferring the substrate between the processing station and the housing section, (c) inspection equipment for detecting the presence or absence of a defect in the substrate, and (d) an interface section disposed between the processing station and the aligner, including a housing section for temporarily housing the substrate which is carried into/out of the aligner, and a third transfer device for transferring the substrate between the aligner, the processing station, and the inspection equipment, the interface section, into which the substrate is permitted to be carried by the third transfer device, having a defective substrate housing section for housing a plurality of substrates in which defects are detected in the inspection equipment, and the processing station, out of which the substrate is permitted to be carried by the second transfer device, having a stripper for stripping the resist of the substrate in which a defect is detected in the inspection equipment, and further having transfer means for transferring the substrate from the defective substrate housing section to the stripper.

A sixth aspect of the present invention is a processing method in a processing apparatus comprising a plurality of kinds of processing units for performing processing necessary for coating a substrate with a resist and processing necessary for developing the resist on the substrate, inspection equipment for detecting the presence or absence of a defect in the substrate, a stripper for stripping the resist of the substrate, and transfer means for transferring the substrate between the processing units and between the processing units, the inspection equipment, and the stripper, comprising the steps of (a) inspecting the substrate which has undergone processing in one of the processing units and detecting the presence or absence of a defect in the substrate in the inspection equipment, (b) stripping the resist of the substrate in which a defect is detected in the stripper after the step (a), and (c) reprocessing the substrates of which resists are stripped in the plurality of kinds of processing units after the step (b).

According to the present invention, a substrate processed in a specific processing unit such as a resist coating unit is transferred to inspection equipment by a transfer device. Accordingly, the substrate is transferred not by an operator but by the transfer device, whereby the substrate is not artificially contaminated.

These objects and still other objects and advantages of the present invention will become apparent upon reading the following specification when taken in conjunction with the accompanying drawings.

BRIEF DESCRIPTION OF THE DRAWINGS

FIG. 4 is a side view showing inspection equipment with a multi-tiered configuration;

FIG. 5 is a flowchart showing the flow of processing in the coating and developing system shown in FIG. 1;

DETAILED DESCRIPTION OF THE PREFERRED EMBODIMENTS

Figure 1:
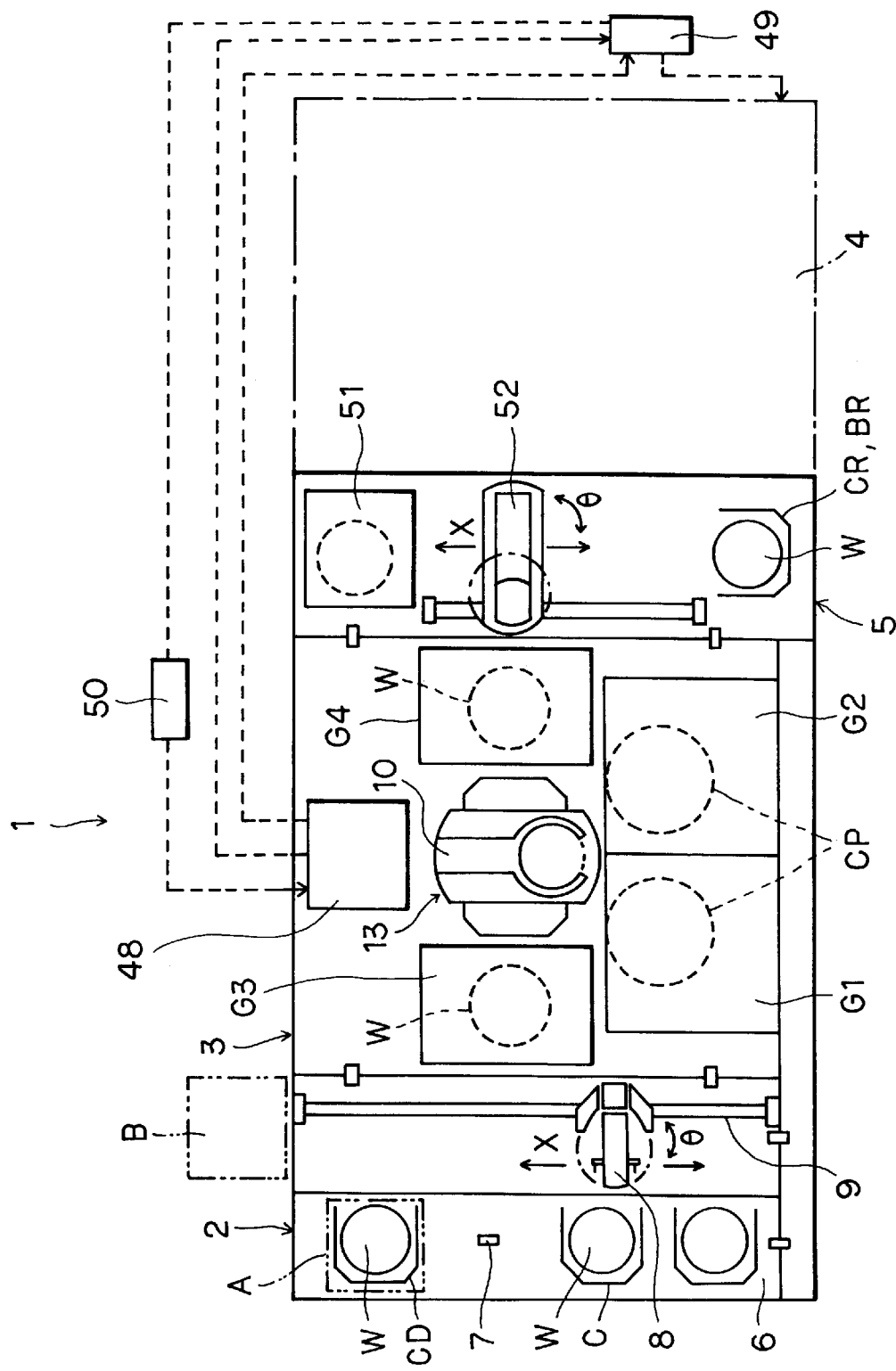
FIG. 1 is a plane view of a coating and developing system according to an embodiment of the present invention.

As shown in FIG. 1, a coating and developing system 1 has a configuration in which a cassette station 2 as a processing station for transferring, for example, 25 wafers W per cassette, as a unit, from/to the outside into/from the coating and developing system 1 and carrying the wafer W into/out of a cassette C, a processing station 3 in which various kinds of processing units each for performing predetermined processing for the wafers W one by one are multi-tiered, and an interface section 5 for sending and receiving the wafer W to/from an aligner 4 provided adjacent to the processing station 3 are integrally connected.

In the cassette station 2, three cassettes C, for example, can be freely mounted with respective transfer ports for the wafer W facing the processing station 3 at the positions of positioning projections 7 on a cassette mounting table 6 in a line in an X-direction (a vertical direction in FIG. 1). In this embodiment, the cassettes C for housing unprocessed wafers W and a cassette CD for housing wafers W in which defects are detected in inspection equipment 48 which will be described later are specially mounted on the cassette mounting table 6. A wafer transfer body 8 movable in the direction of arrangement of the cassettes (the X-direction) and in the direction of arrangement of the wafers W housed in the cassette C (a Z-direction: a vertical direction) is movable along a transfer path 9 and selectively accessible to each of the cassettes C and the cassette CD.

The wafer transfer body 8 is also structured to be rotatable in a θ-direction (a direction of rotation around a Z-axis) so that it is accessible to an alignment unit 32 and an extension unit 33 included in a multi-tiered unit section in a third processing unit group $G_3$ on the processing station 3 side as described later.

In the processing station 3, a main transfer device 13 provided with three pairs of tweezers 10, 11, and 12 for holding the wafer W at the upper, middle, and lower positions, respectively, is disposed in the center thereof. Around the main transfer device 13, various kinds of processing units are multi-tiered to compose processing unit groups. In the coating and developing system 1, four processing unit groups $G_1$, $G_2$, $G_3$, and $G_4$ can be arranged. The first and second processing unit groups $G_1$ and $G_2$ are arranged on the front side of the coating and developing system 1, the third processing unit group $G_3$ is arranged adjacent to the cassette station 2, and the fourth processing unit group $G_4$ is arranged adjacent to the interface section 5.

Figure 2:
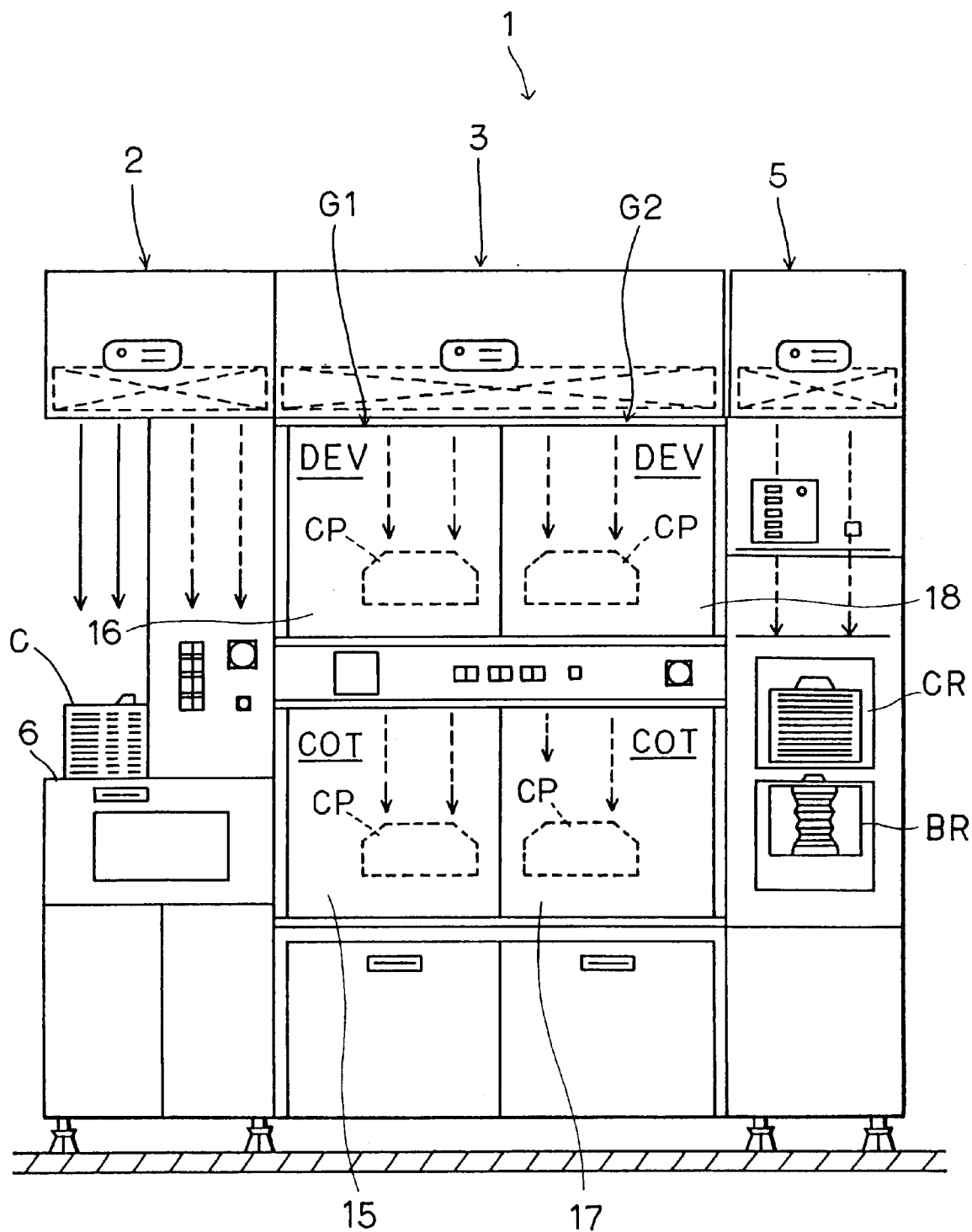
FIG. 2 is a front view of the coating and developing system shown in FIG. 1.

In the first processing unit group $G_1$, two kinds of spinner-type processing units, for example, a resist coating unit 15 for coating the wafer W with a resist and a developing unit 16 for supplying a developing solution to the wafer W are two-tiered from the bottom in order as shown in FIG. 2. In the second processing unit group $G_2$, a resist film stripping unit 17 for stripping the resist formed on the wafer W and a developing unit 18 are two-tiered from the bottom in order.

Figure 3:
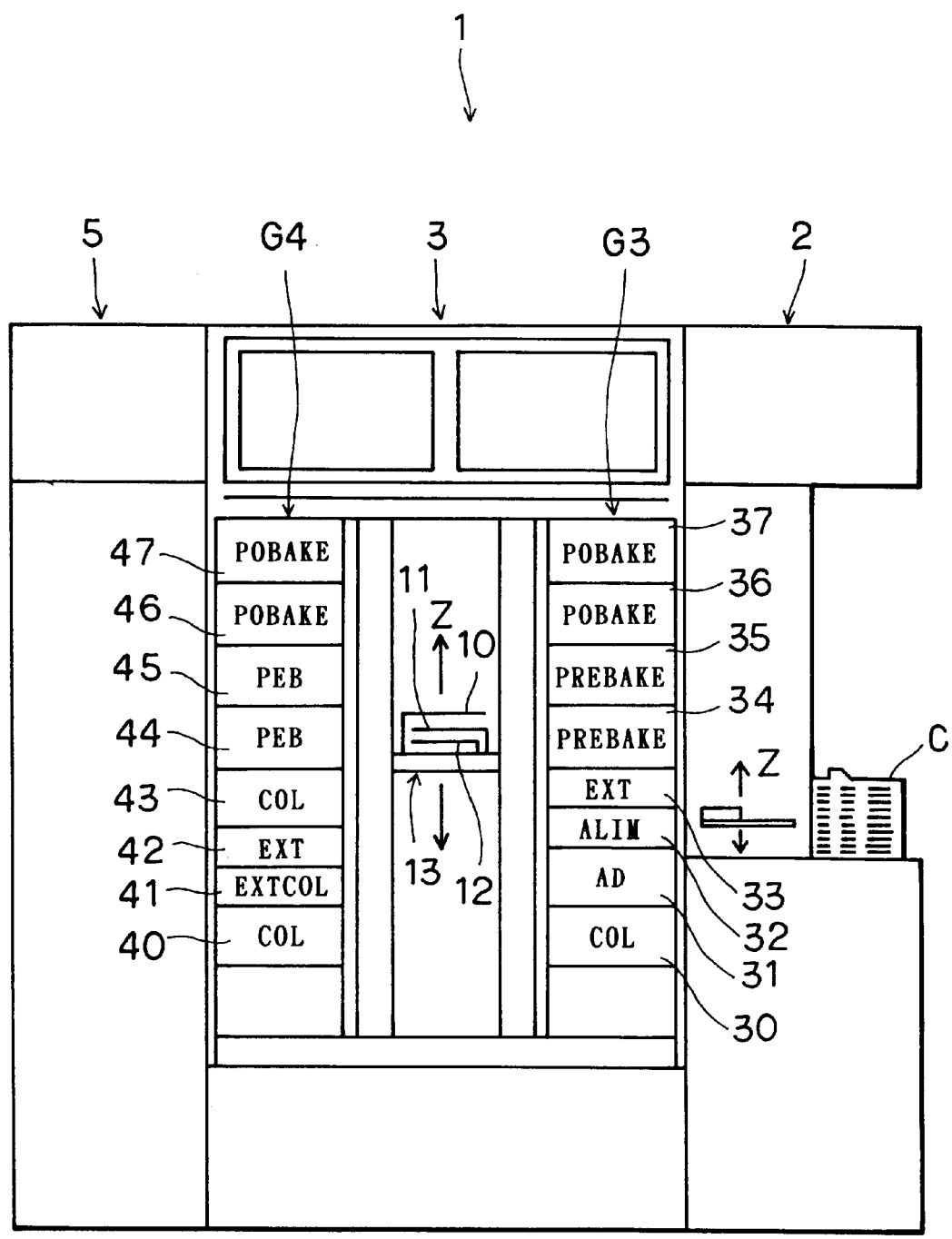
FIG. 3 is a rear view of the coating and developing system shown in FIG. 1.

As shown in FIG. 3, in the third processing unit group $G_3$, oven-type processing units in each of which the wafer W is placed on a mounting table to undergo predetermined processing, for example, a cooling unit 30 for performing cooling processing, an adhesion unit 31 for enhancing fixedness of the resist and the wafer W, an alignment unit 32 for aligning the wafer W, an extension unit 33 for keeping the wafer W waiting, prebaking units 34 and 35 for performing thermal processing before exposure, and postbaking units 36 and 37 for performing thermal processing after developing are, for instance, eight-tiered from the bottom in order.

In the fourth processing unit group $G_4$, for example, a cooling unit 40, an extension and cooling unit 41 for naturally cooling the mounted wafer W, an extension unit 42, a cooling unit 43, post-exposure baking units 44 and 45 for performing thermal processing after exposure, and post-baking units 46 and 47 are, for instance, eight-tiered from the bottom in order.

The inspection equipment 48 for inspecting the wafers W one by one is provided on the rear side of the processing station 3. The inspection equipment 48 detects the presence or absence of defects in the wafer W which is selected out of the wafers W after developing, for example, for every given number of wafers, and more specifically the following inspections are performed.

Namely, twelve kinds of inspections in total, that is, a defocusing inspection for detecting misregistration of a pattern occurring in the aligner 4, a coating unevenness detecting inspection for detecting unevenness of coating of the resist solution, a poor developing detecting inspection for detecting poor developing, a scratch detecting inspection for detecting minute scratches on the surface of the wafer W, a particle detecting inspection for detecting particles adhering to the wafer W, a comet detecting inspection for detecting comets caused by bubbles or dust particles in the resist solution on the surface of the wafer W after resist-coating, a splash-back detecting inspection for detecting splash-back in which a solvent of the resist solution springing out of the surface of the wafer W adheres again to the wafer W, a common defect detecting inspection for detecting common defects which occur at the same position with the same shape on the surfaces of the wafers W, a scum detecting inspection for detecting scum of the resist remaining on the wafer W after developing, a clamping inspection for detecting scars left at a wafer edge by clamping the wafer edge in a process previous to the photolithography, a NO RESIST and NO DEVELOP inspection for detecting the non-performance of resist coating processing and developing processing, and a line width measuring inspection for measuring the line width of the resist film formed on the wafer W are performed by one inspection equipment 48.

When registration accuracy of the wafer W exposed in the aligner 4 and a photomask is inspected as compared with a specification value in addition to the aforesaid twelve kinds of inspections, a registration inspection is made in dedicated inspection equipment 48' provided on the top of the inspection equipment 48 separately from the inspection equipment 48 as shown in FIG. 4. A series of these inspections are divided into macro-inspections and micro-inspections. Defects of 20 μm or more, for example, can be detected by the macro-inspections and defects of 0.1 μm or more, for example, can be detected by the micro-inspections.

The presence or absence of defects detected in the inspection equipment 48 and 48' is sent as a detection signal to a controller 49.

Out of a series of the inspections, the defocusing inspection is to inspect defocusing in the aligner, for example, in comparison with a previously registered correct pattern. The line width measuring inspection is to detect whether light exposure and exposure time in the aligner are proper, for example, as compared with a previously registered correct pattern. The registration inspection is to detect misregistration of exposure in the aligner, for example, by comparing a pattern of a specific portion which can be compared to a lower layer of pattern with a previously registered correct pattern.

When defects are detected by the defocusing inspection, the registration inspection, or the line width measuring inspection out of the aforesaid series of inspections, exposure conditions for the aligner 4 are suitably changed. When defocusing is detected by the defocusing inspection, for example, a focal distance is suitably adjusted. When misregistration is detected by the registration inspection, the position of the wafer during exposure is adjusted. Further, when poor line width of the pattern is detected by the line width measuring inspection, exposure time and light exposure in the aligner are suitably adjusted.

A fixed buffer cassette BR and a transportable pickup cassette CR, for example, are two-tiered from the bottom in order at the front of the interface section 5, and a peripheral aligner 51 is disposed at the rear thereof. A wafer transfer body 52 which is disposed between both the cassettes BR and CR and the peripheral aligner 51, is provided at the center of the interface section 5. The wafer transfer body 52 is movable in the X-direction (the vertical direction in FIG. 1) and the Z-direction (the vertical direction) and rotatable in the θ-direction (the direction of rotation around the Z-axis) to be accessible to both the cassettes BR and CR, the aligner 4, the peripheral aligner 51, the extension and cooling unit 41, and the extension unit 42.

The coating and developing system 1 is configured as above.

Next, the operation of the coating and developing system 1 will be explained with reference to FIG. 5.

First, the wafer transfer body 8 selects one unprocessed wafer W from the cassette C mounted on the cassette mounting table 6 in the cassette station 2 (step 501). The selected wafer W is transferred to the alignment unit 32 included in the third processing unit group $G_3$ on the processing station 3 side by means of the wafer transfer body 8. The wafer W which has undergone alignment is transferred to the adhesion unit 31 and the cooling unit 30 in sequence to undergo predetermined processing, and thereafter transferred to the resist coating unit 15, where predetermined resist coating processing is performed (step 502).

The wafer W which has undergone the resist coating processing is transferred to the prebaking unit 33, the extension and cooling unit 41, and the peripheral aligner 51 in sequence to undergo predetermined processing, and thereafter undergoes exposure processing in the aligner 4 (step 503).

The exposed wafer W is transferred to the extension unit 42 and the post-exposure baking unit 44 in order and undergoes predetermined processing in each of these units. Subsequently, after being developed in the developing unit 16 (step 504), the waferW is transferred to the postbaking unit 46, the cooling unit 30, and the extension unit 33 in sequence to undergo predetermined processing (step 505), and then taken out of the extension unit 33 by the wafer transfer body 8 and housed in the cassette C for housing processed wafers W (step 506). Thus, a series of coating and developing processing for the wafer W is completed.

In the coating and developing system 1, one wafer W is picked out of wafers which have undergone developing processing in the developing unit 16, for example, for every given number of processed wafers by the main transfer device 13 (step 507), and the picked wafer W is transferred to the inspection equipment 48 to undergo inspections (step 508).

In other words, the wafer W for inspection selected from the developing unit 16 is transferred to the inspection equipment 48 by the main transfer device 13, and the aforesaid series of inspections are performed in the inspection equipment 48. The presence or absence of defects in the wafer W for inspection is sent as a detection signal to the controller 49.

In the above case, when no defect is detected in the wafer W for inspection (step 509), the predetermined processing is continuously performed for the wafer W for inspection (step 505). Namely, the wafer W for inspection is taken out of the inspection equipment 48 with the tweezers 11 of the main transfer device 13, and transferred to the postbaking unit 36 in which the following processing step is performed.

Meanwhile, when defects are detected in the wafer W for inspection (step 509), the wafer W is taken out of the inspection equipment 48 with the tweezers 11 of the main transfer device 13, and thereafter transferred to the resist film stripping unit 17 included in the second processing unit group $G_2$. A resist film with defects is stripped in the resist film stripping unit 17 (step 510). The wafer W of which the resist film is stripped is taken out with the tweezers 11 of the main transfer device 13 and transferred to the extension unit 33, where the wafer W stands by. Subsequently, the wafer W is taken out by means of the wafer transfer body 8, and then housed in the cassette CD which is exclusive for housing wafers w in which defects are detected (step 511).

The wafer W in which defects are detected in the inspection equipment 48 is thus housed in the cassette CD. Hence, coating and developing processing after developing processing is not performed for the wafer W with defects. As a result, the wafer W in which defects are detected is removed from a processing line of the coating and developing system 1.

When 25 wafers W, for example, are housed in the cassette CD, the aforesaid series of coating and developing processing is performed for the wafers W housed in the cassette CD from the beginning (step 501). Namely, the wafers W are reprocessed.

When defects are detected in the wafer W for inspection by the defocusing inspection, the line width measuring inspection, or the registration inspection, exposure conditions for the aligner 4 are amended by the controller 49 which receives a detection signal from the inspection equipment 48. Especially, when the misregistration of the pattern is detected by the defocusing inspection, focusing performed in the aligner 4 is suitably adjusted. Exposure processing under suitable exposure conditions is performed for wafers W which undergo coating and developing processing after the above wafer W owing to the above amendment of exposure conditions.

Moreover, when frequency of detection of defects in the inspection equipment 48 is high, a frequency regulating mechanism 50 is adjusted so that the controller 49 makes the defect detecting inspections more frequently. Thus, frequency of inspections of the wafers W in the inspection equipment 48 increases, which makes it possible to discover the defective wafers W in advance, thereby preventing a lowering of yield.

Conversely, when frequency of detection of defects in the inspection equipment 48 is low, the inspection frequency of the wafers W in the inspection equipment 48 is decreased by adjustment of the frequency regulating mechanism 50. Thus, the number of inspections for the wafers W which do not need inspections in the inspection equipment 48 can be decreased. Consequently, efficient inspections are made possible by adjusting the frequency regulating mechanism 50.

As explained above, when the wafer W is first transferred from the developing unit 16 to the inspection equipment 48, the wafer W is transferred by means of the main transfer device 13 in this embodiment, thereby preventing artificial contamination of the wafer W during transfer.

The wafer W in which defects are detected in the inspection equipment 48 is transferred by the main transfer device 13 from the inspection equipment 48 to the resist film stripping unit 17, where the resist film is stripped, and thereafter the wafer W is housed in the cassette CD so as to undergo reprocessing.

Hence, the wafers W in which defects are detected can be removed from the processing line of the coating and developing system 1. Further, since the wafers W in which defects are detected are stored in the cassette CD, the wafers W can be gathered in one place, thereby enabling the following measures against the defective wafers W to be taken efficiently. Furthermore, the wafers W are reprocessed after the resist films having defects are stripped, thus making reuse of the wafers W possible.

When defects are detected by the defocusing inspection, the line width measuring inspection, or the registration inspection, exposure conditions for the aligner 4 can be controlled by the controller 49. Therefore, the wafers W, which undergo coating and developing processing after the above wafer W in which defects are detected, can be exposed under suitable exposure conditions.

Although the aforesaid embodiment is explained with the given example in which the inspection equipment 48 is positioned on the rear side of the processing station 3, the present invention is not limited to this example. For example, it is suitable that the inspection equipment 48 is disposed in the position of two-dot chain line A on the cassette mounting table 6, the wafer W to be inspected is transferred to the extension unit 33 by the main transfer device 13, and that the wafer W is then transferred to the inspection equipment 48 by the wafer transfer body 8. Alternatively, the inspection equipment 48 may be disposed in the position of two-dot line B. In the above cases, the wafer W is not artificially transferred, thus making it possible to prevent artificial contamination of the wafer W.

Figure 6:
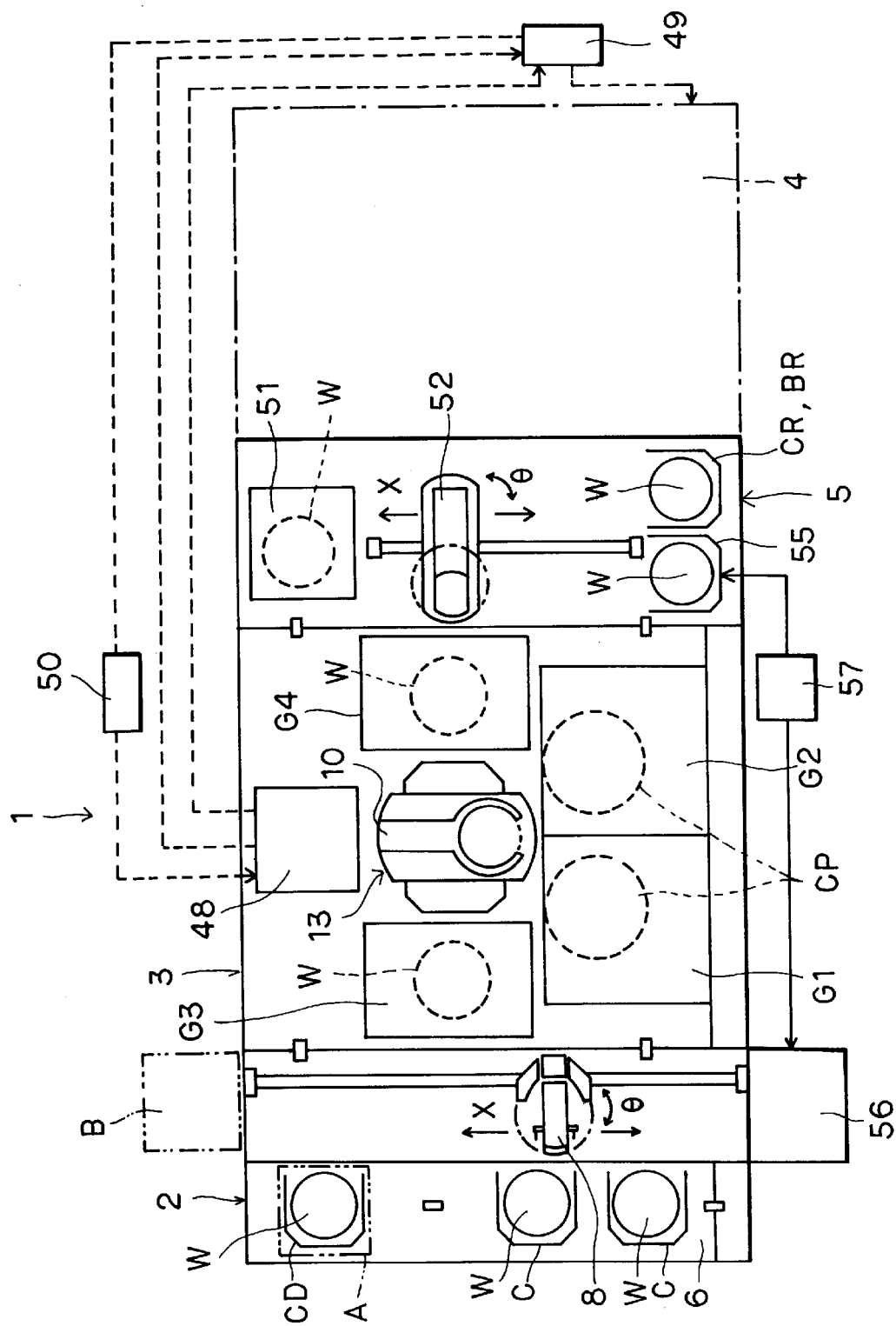
FIG. 6 is a plane view of a coating and developing system according to another embodiment of the present invention.

Further, in the present invention, as shown in FIG. 6, it is suitable that a cassette 55 is disposed on the front side of the interface section 5, a resist film removing unit 56 is disposed adjacently on the front side of the cassette station 2, and that the wafer W is transferred between the cassette 55 and the resist film removing unit 56 by means of a transfer robot 57.

According to the above configuration, the wafer W in which defects are detected in the inspection equipment 48 is transferred to the extension unit 42 by the main transfer device 13. Subsequently, the wafer W is taken out of the extension unit 42 by the wafer transfer body 52, and then housed in the cassette 55. The wafer W housed in the cassette 55 is transferred by the transfer robot 57 to the resist film removing unit 56, where the resist film of the wafer W is removed. Thereafter, the wafer W of which the resist film is removed is taken out by the wafer transfer body 8 and housed in the cassette CD on the cassette mounting table 6. The wafer W housed in the cassette CD is reprocessed.

The aforesaid disposition of the so-called "exterior type" resist film removing unit 56 on the front side of cassette station 2 allows a batch chemical cleaner and the like, for example, to be used as the resist film removing unit 56. Accordingly, resist films of a larger number of wafers W can be stripped at one time compared with the case where a resist film is stripped in the resist film stripping unit 17 as in the aforesaid embodiment.

Further, in the aforesaid embodiment, the example in which the inspection equipment 48 is contained in the coating and developing system 1 or disposed adjacent thereto. In the present invention, however, it is possible to propose another embodiment in which the inspection equipment 48 is disposed in a place away from the coating and developing system 1.

Figure 7:
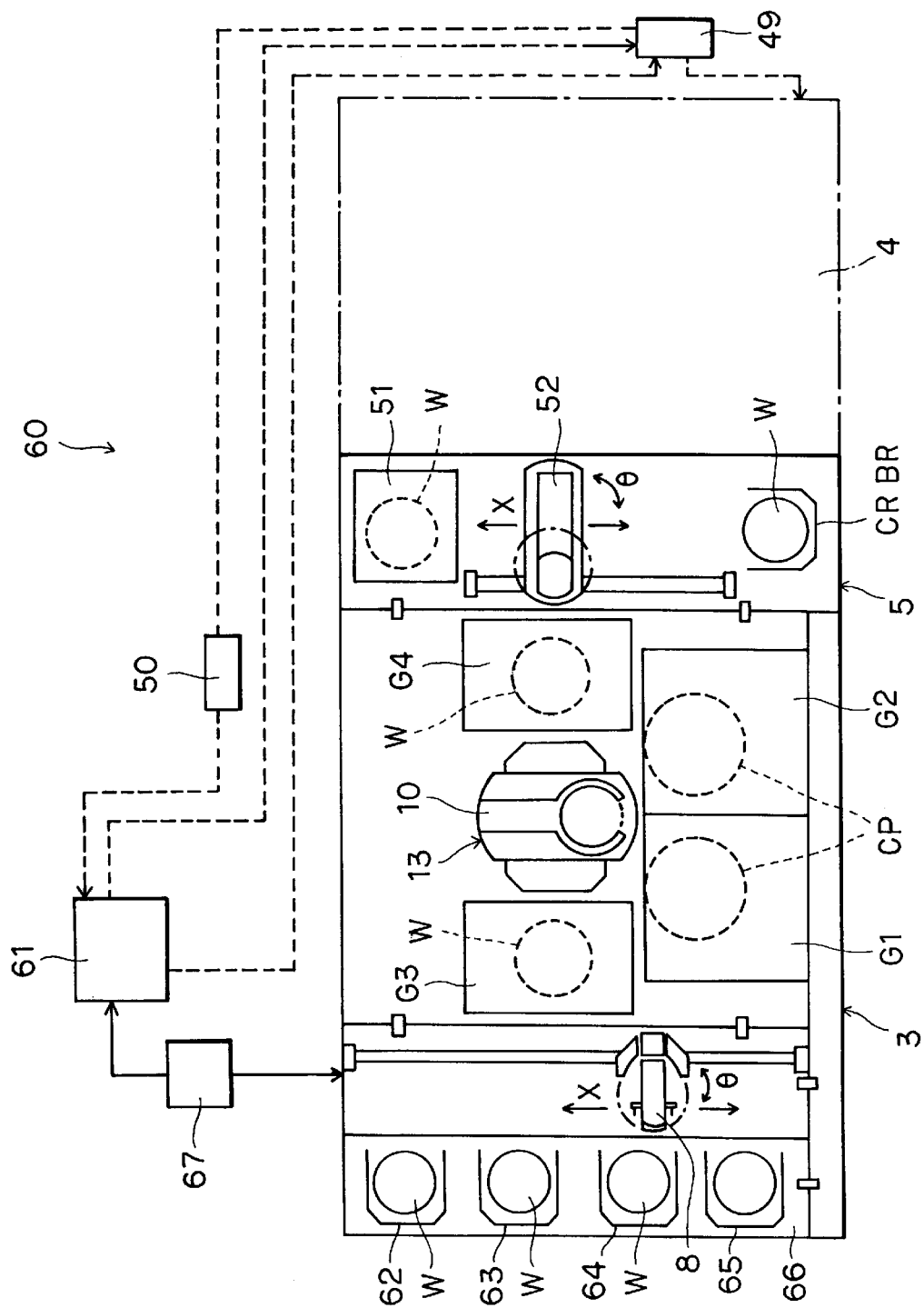
FIG. 7 is a plane view of a coating and developing system according to still another embodiment of the present invention.

FIG. 7 shows a coating and developing system 60 with such a configuration, which includes inspection equipment 61 disposed outside the coating and developing system 60, a cassette mounting table 66 on which up to four cassettes 62, 63, 64, and 65 can be mounted, and a transfer robot 67 which can transfer the wafer W between the wafer transfer body 8 and the inspection equipment 61.

According to the above configuration, the wafer W for inspection which has undergone developing processing is taken out of the developing unit 16 by the main transfer device 13 for every given number of wafers, and then transferred to the extension unit 33. Subsequently, this wafer W is taken out of the extension unit 33 by the wafer transfer body 8 and then delivered to the transfer robot 67. The wafer W delivered to the transfer robot 67 is then transferred to the inspection equipment 61 to undergo predetermined inspections.

The wafer W in which no defect is detected in the inspection equipment 61 is taken out of the inspection equipment 61 by the transfer robot 67, and thereafter delivered to the wafer transfer body 8. The wafer W delivered to the wafer transfer body 8 is transferred to the extension unit 33, and then transferred to the postbaking unit 37 by the main transfer device 13 to undergo a series of coating and developing processing after the developing processing.

Meanwhile, the wafer W in which defects are detected in the inspection equipment 61 is taken out of the inspection equipment 61 by the transfer robot 67, and then delivered to the wafer transfer body 8 by the transfer robot 67. The wafer W delivered to the wafer transfer body 8 is carried into the extension unit 33, and thereafter transferred by the main transfer device 13 to the resist film stripping unit 17, where the resist film thereof is stripped. Subsequently, the wafer W of which the resist film is stripped is transferred from the resist film stripping unit 17 to the extension unit 33 by the main transfer device 13, and then taken out by the wafer transfer body 8 and housed in the cassette 62. After 25 wafers W, for example, are thus housed in the cassette 62, reprocessing is performed for these wafers W.

In the aforesaid another embodiment, as described above, the wafer W is transferred between the coating and developing system 1 and the inspection equipment 61 disposed apart from the coating and developing system 1 by means of the transfer robot 67. Accordingly, as is the case with the aforesaid embodiment, the artificial contamination of the wafer W during the transfer to the inspection equipment 61 can be prevented.

Figure 8:
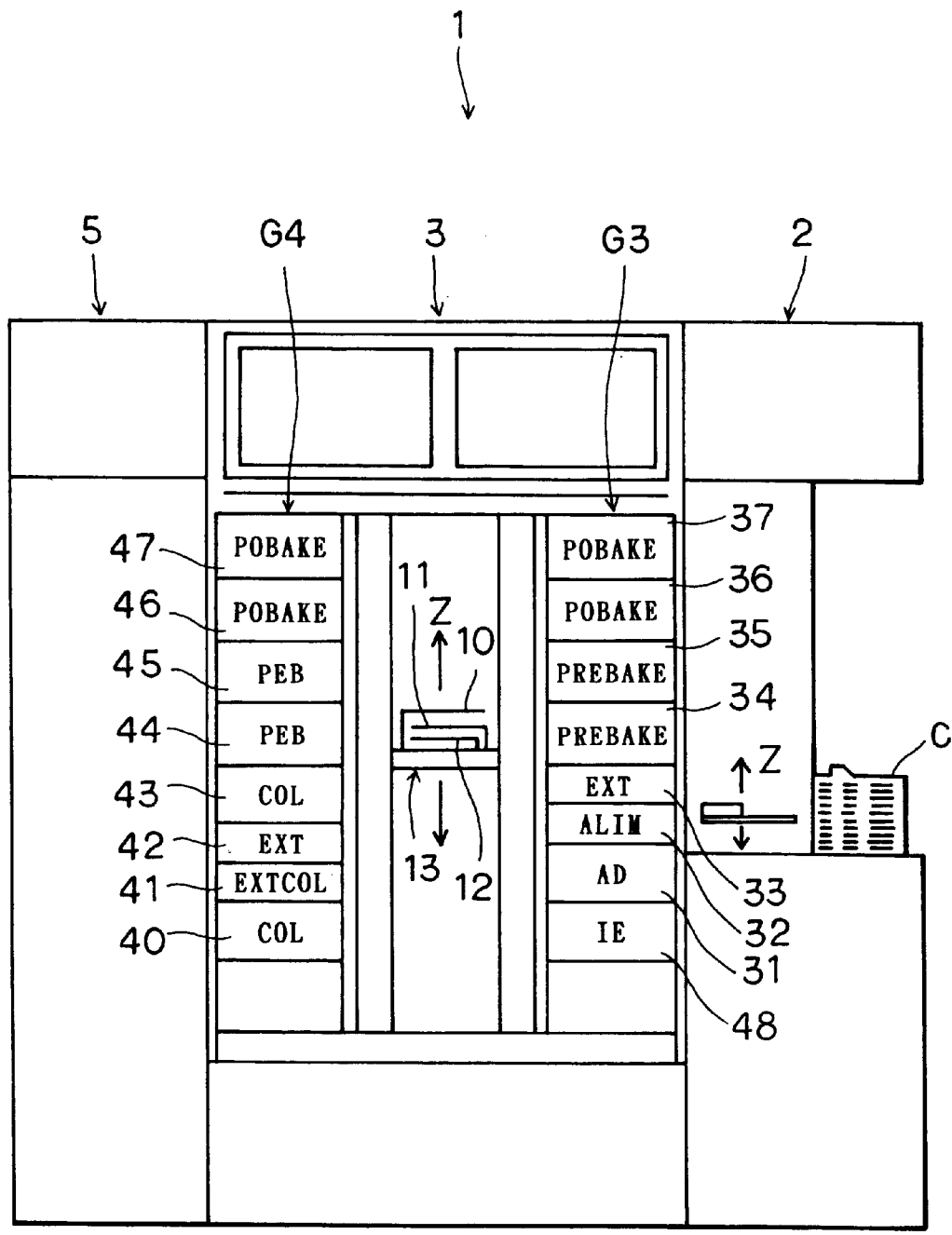
FIG. 8 is a rear view of a coating and developing system according to yet another embodiment of the present invention.

Incidentally, as shown in FIG. 8, for example, the inspection equipment 48 may be positioned at the lowest tier, for instance, of the third processing unit group $G_3$ in the processing station 3. The wafer can be carried into/out of this inspection equipment 48 by the wafer transfer body 8 as well as the main transfer device 13. According to the above configuration, compared with the configuration shown in FIG. 1, a space on the rear side exclusive for the inspection equipment 48 is unoccupied, and hence another multi-tiered processing unit group is additionally disposed in this space. Further, the wafer in which defects are detected can be taken out more directly to the outside by the wafer transfer body 8.

Figure 9:
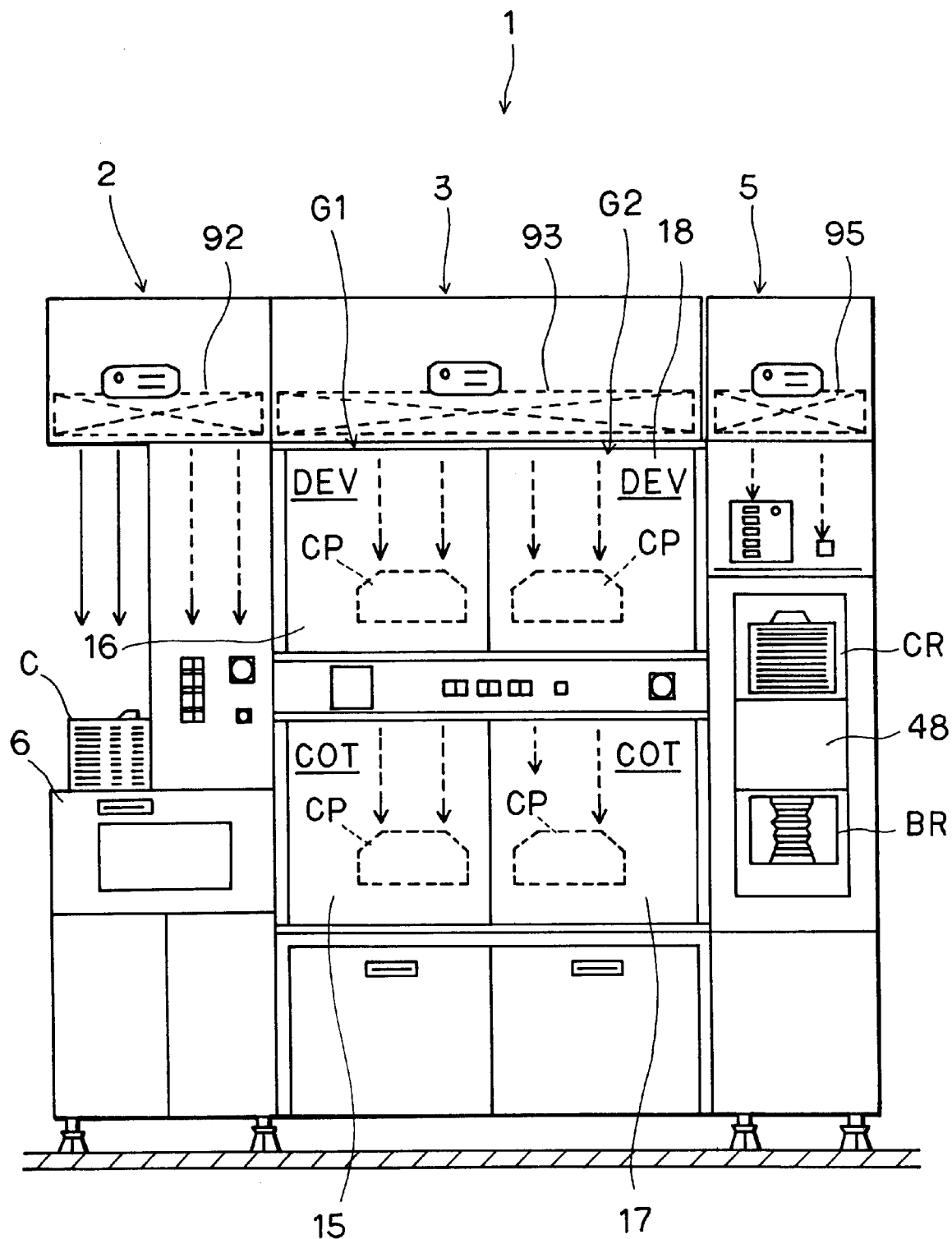
FIG. 9 is a front view of a coating and developing system according to still another embodiment of the present invention.

As shown in FIG. 9, for example, the inspection equipment 48 may be disposed on top of the buffer cassette BR in the interface section 5. Separate clean air supply sections 92, 93, and 95 are placed respectively on top of the cassette station 2, the processing station 3, and the interface section 5. The respective clean air supply sections 92, 93, and 95 supply clean air of which the temperature is controlled downward, and especially the clean air supply section 95 in the interface section 5 controls the temperature of the interface section 5 adjacent to the aligner which requires the most precise temperature control, and hence controls the temperature more precisely than the other sections. Accordingly, the disposition of the inspection equipment 48 in the interface section 5 enables inspections to be made under favorable environment in which the temperature is precisely controlled, and consequently the inspections can be performed more precisely.

Although the aforesaid embodiment is explained with the given example in which the wafer W selected from the developing unit 16 is inspected, the present invention is not limited to this example. Even when the wafer W picked out of another developing unit 18 is inspected, for example, the present invention is naturally applicable. Moreover, it is possible that a plurality of inspection equipment 48 are provided in the coating and developing system 1 and a plurality of inspection equipment 61 are provided in the coating and developing system 60 respectively so that a series of inspections are shared among the plurality of inspection equipment.

Further, although the wafer W selected every given number of wafers from the developing unit 16 is used as the wafer W for inspection in the aforesaid embodiment, in place of this, a wafer W selected for every lot passing on the processing line of the coating and developing system 1 or 60 or a wafer W picked out for every given period of time may be used as the wafer W for inspection in the present invention.

Furthermore, a substrate to be used is explained with the wafer W in the aforesaid embodiment. The present invention, however, can be applied to cases where other substrates such as an LCD substrate, a CD substrate, and the like are used.

The aforesaid embodiment has the intention of clarifying technical meaning of the present invention. Therefore, the present invention is not intended to be limited to the above concrete embodiment and to be interpreted in a narrow sense, and various changes may be made therein without departing from the spirit of the present invention and within the meaning of the claims.

What is claimed is:

1. A processing apparatus for coating a substrate with a resist and developing an exposed resist on the substrate, comprising:

a plurality of kinds of processing units for performing processing necessary for coating the substrate with the resist and processing necessary for developing the resist on the substrate;

inspection equipment for inspecting the substrate which has undergone processing in one of said processing units and detecting the presence or absence of a defect in the substrate; and transfer means for transferring the substrate between said processing units and between said processing units and said inspection equipment.

2. The apparatus as set forth in claim 1,
wherein said transfer means includes
a first transfer device for transferring the substrate between said processing units, and
a second transfer device for transferring the substrate between said processing units and said inspection equipment.

3. The apparatus as set forth in claim 1, further comprising:

a defective substrate housing section for housing the substrate in which a defect is detected in said inspection equipment.

4. The apparatus as set forth in claim 1, further comprising:
a controller for controlling exposure conditions for an aligner for exposing the resist formed on the substrate when a defect is detected in said inspection equipment.

5. The apparatus as set forth in claim 4, wherein the exposure conditions are at least one of a focal distance, light exposure, and exposure time in the aligner.

6. The apparatus as set forth in claim 1, further comprising:
a frequency regulating mechanism for regulating inspection frequency in said inspection equipment according to frequency of occurrence of the defect detected in said inspection equipment.

7. The apparatus as set forth in claim 1, further comprising:
a stripper for stripping the resist of the substrate in which a defect is detected in said inspection equipment.

8. The apparatus as set forth in claim 1, wherein said plurality of kinds of processing units include at least a coating unit for coating the substrate with the resist and a developing unit for developing the exposed resist on the substrate.

9. A processing apparatus for coating a substrate with a resist and developing the exposed resist on the substrate, comprising:
(a) a processing station including
a coating unit for coating the substrate with the resist,
a developing unit for developing the exposed resist on the substrate, and
a first transfer device for transferring the substrate between the coating unit and the developing unit; and
(b) a housing station disposed adjacent to said processing station, including
inspection equipment for detecting the presence or absence of a defect in the substrate,
a housing section for housing a plurality of substrates before and after processing in said processing station and a plurality of substrates in which defects are detected by the inspection equipment, and
a second transfer device for transferring the substrate between said processing station and the housing section.

10. A processing apparatus for coating a substrate with a resist and developing the exposed resist on the substrate, comprising:
(a) a processing station including
a coating unit for coating the substrate with the resist,
a developing unit for developing the exposed resist on the substrate,
a multi-tiered processing unit group in which at least a heating unit for heat-treating the substrate and inspection equipment for detecting the presence or absence of a defect in the substrate are multi-tiered, and
a first transfer device for transferring the substrate between the coating unit, the developing unit, and the multi-tiered processing unit group; and
(b) a housing station disposed adjacent to said processing station, including
a housing section for housing a plurality of substrates before and after processing in said processing station, and a plurality of substrates in which defects are detected by said inspection equipment, and
a second transfer device for transferring the substrate between said processing station and the housing section.

11. The apparatus as set forth in claim 10, wherein the substrate is permitted to be delivered between the inspection equipment and the second transfer device.

12. A processing apparatus, disposed adjacent to an aligner for exposing a resist coated on a substrate, for coating the substrate with the resist and developing the resist on the substrate exposed by the aligner, comprising:
(a) a processing station including
a coating unit for coating the substrate with the resist,
a developing unit for developing the exposed resist on the substrate,
a delivery unit for delivering the substrate, and
a first transfer device for transferring the substrate between the coating unit, the developing unit, and the delivery unit; and
(b) an interface section disposed between said processing station and the aligner, including
a housing section for temporarily housing the substrate which is carried into/out of the aligner,
inspection equipment for detecting the presence or absence of a defect in the substrate, and
a second transfer device for transferring the substrate between the aligner, the delivery unit in said processing station, the housing section, and the inspection equipment.

13. The apparatus as set forth in claim 12, wherein a first temperature controller for controlling the temperature in said processing station and a second temperature controller for controlling the temperature in said interface section are separately provided.

14. A processing apparatus, disposed adjacent to an aligner for exposing a resist coated on a substrate, for coating the substrate with the resist and developing the resist on the substrate exposed by the aligner, comprising:
(a) a processing station including
a coating unit for coating the substrate with the resist,
a developing unit for developing the exposed resist on the substrate, and
a first transfer device for transferring the substrate between the coating unit and the developing unit;
(b) a housing station disposed adjacent to said processing station, including
a housing section for housing a plurality of substrates before and after processing in said processing station, and
a second transfer device for transferring the substrate between said processing station and the housing section;
(c) inspection equipment for detecting the presence or absence of a defect in the substrate; and
(d) an interface section disposed between said processing station and the aligner, including
a housing section for temporarily housing the substrate which is carried into/out of the aligner, and
a third transfer device for transferring the substrate between the aligner, said processing station, and said inspection equipment,
said interface section, into which the substrate is permitted to be carried by the third transfer device, having a defective substrate housing section for housing a plurality of substrates in which defects are detected in said inspection equipment, and said processing station, out of which the substrate is permitted to be carried by the second transfer device, having a stripper for stripping the resist of the substrate in which a defect is detected in said inspection equipment, and further having transfer means for transferring the substrate from the defective substrate housing section to the stripper.

15. The apparatus as set forth in claim 14, wherein the transfer means is a transfer robot for transferring a plurality of substrates all together from the defective substrate housing section to the stripper, and wherein the stripper is a batch chemical cleaner.

16. A processing method in a processing apparatus comprising a plurality of kinds of processing units for performing processing necessary for coating a substrate with a resist and processing necessary for developing the resist on the substrate, inspection equipment for detecting the presence or absence of a defect in the substrate, a stripper for stripping the resist of the substrate, and transfer means for transferring the substrate between the processing units and between the processing units, the inspection equipment, and the stripper, comprising the steps of:

(a) inspecting the substrate which has undergone processing in one of the processing units and detecting the presence or absence of a defect in the substrate in the inspection equipment, (b) stripping the resist of the substrate in which a defect is detected in the stripper after said step (a), and (c) reprocessing the substrates of which resists are stripped in the plurality of kinds of processing units after said step (b).

* * * * *